United States Patent
Zhao

(10) Patent No.: US 10,716,206 B2
(45) Date of Patent: Jul. 14, 2020

(54) FLEXIBLE PRINTED CIRCUIT BOARD RETURN PATH DESIGN WITH ALIGNED COMPANION TRACE ON GROUND PLANE

(71) Applicant: OmniVision Technologies, Inc., Santa Clara, CA (US)

(72) Inventor: Jin Zhao, San Jose, CA (US)

(73) Assignee: OmniVision Technologies, Inc., Santa Clara, CA (US)

(*) Notice: Subject to any disclaimer, the term of this patent is extended or adjusted under 35 U.S.C. 154(b) by 51 days.

(21) Appl. No.: 16/056,906

(22) Filed: Aug. 7, 2018

(65) Prior Publication Data
US 2020/0053876 A1 Feb. 13, 2020

(51) Int. Cl.
| H05K 1/18 | (2006.01) |
|---|---|
| H05K 1/02 | (2006.01) |
| H05K 1/09 | (2006.01) |
| H05K 1/03 | (2006.01) |

(52) U.S. Cl.
CPC ......... H05K 1/0298 (2013.01); H05K 1/0393 (2013.01); H05K 1/09 (2013.01); H05K 1/189 (2013.01); H05K 2201/09227 (2013.01); H05K 2201/09681 (2013.01); H05K 2201/10121 (2013.01); H05K 2201/10151 (2013.01)

(58) Field of Classification Search
CPC .... H05K 1/0393; H05K 1/0298; H05K 1/189; H05K 2201/09681; H05K 2201/10121; H05K 1/0224; H05K 1/0253; H05K 1/0245; H05K 2201/09236; H05K 2201/09272
See application file for complete search history.

(56) References Cited

U.S. PATENT DOCUMENTS

| 7,336,139 | B2 | 2/2008 | Blair et al. | |
|---|---|---|---|---|
| 7,583,160 | B2 | 9/2009 | London | |
| 8,941,012 | B2 * | 1/2015 | Pai | H05K 1/0224 174/254 |
| 10,178,760 | B1 * | 1/2019 | Lee | H05K 1/0242 |
| 2004/0132491 | A1 * | 7/2004 | Kim | H04M 1/0218 455/556.1 |
| 2006/0279371 | A1 * | 12/2006 | Sato | H05K 1/0219 333/1 |
| 2008/0230259 | A1 * | 9/2008 | Booth, Jr. | H05K 1/0224 174/254 |
| 2009/0173533 | A1 * | 7/2009 | Brock | H01R 12/592 174/350 |

(Continued)

*Primary Examiner* — Steven T Sawyer
(74) *Attorney, Agent, or Firm* — Christensen O'Connor Johnson Kindness PLLC

(57) ABSTRACT

A flexible printed circuit board (PCB) includes a flexible first layer proximate to a flexible second layer. Conductive traces are arranged in the flexible first layer and coupled to a first circuit block at a first end of the flexible PCB and coupled to a second circuit block at a second end of the flexible PCB such that the first circuit block is coupled to the second circuit block through the conductive traces. Companion traces re arranged in the flexible second layer to provide a reference plane coupled to the first and second circuit blocks. The companion traces are arranged in the flexible second layer to be replicas of the conductive traces such that each one of the conductive traces is proximate to and aligned with a corresponding one of the companion traces along an entire length between the first and second circuit blocks.

18 Claims, 3 Drawing Sheets

(56) References Cited

U.S. PATENT DOCUMENTS

| | | | | |
|---|---|---|---|---|
| 2010/0061736 A1* | 3/2010 | Kawaguchi | .......... | H05K 1/0234 |
| | | | | 398/139 |
| 2014/0325995 A1* | 11/2014 | Zizzo | ................... | H05K 1/0298 |
| | | | | 60/801 |
| 2019/0008033 A1* | 1/2019 | Chung | ................. | H05K 1/0219 |

* cited by examiner

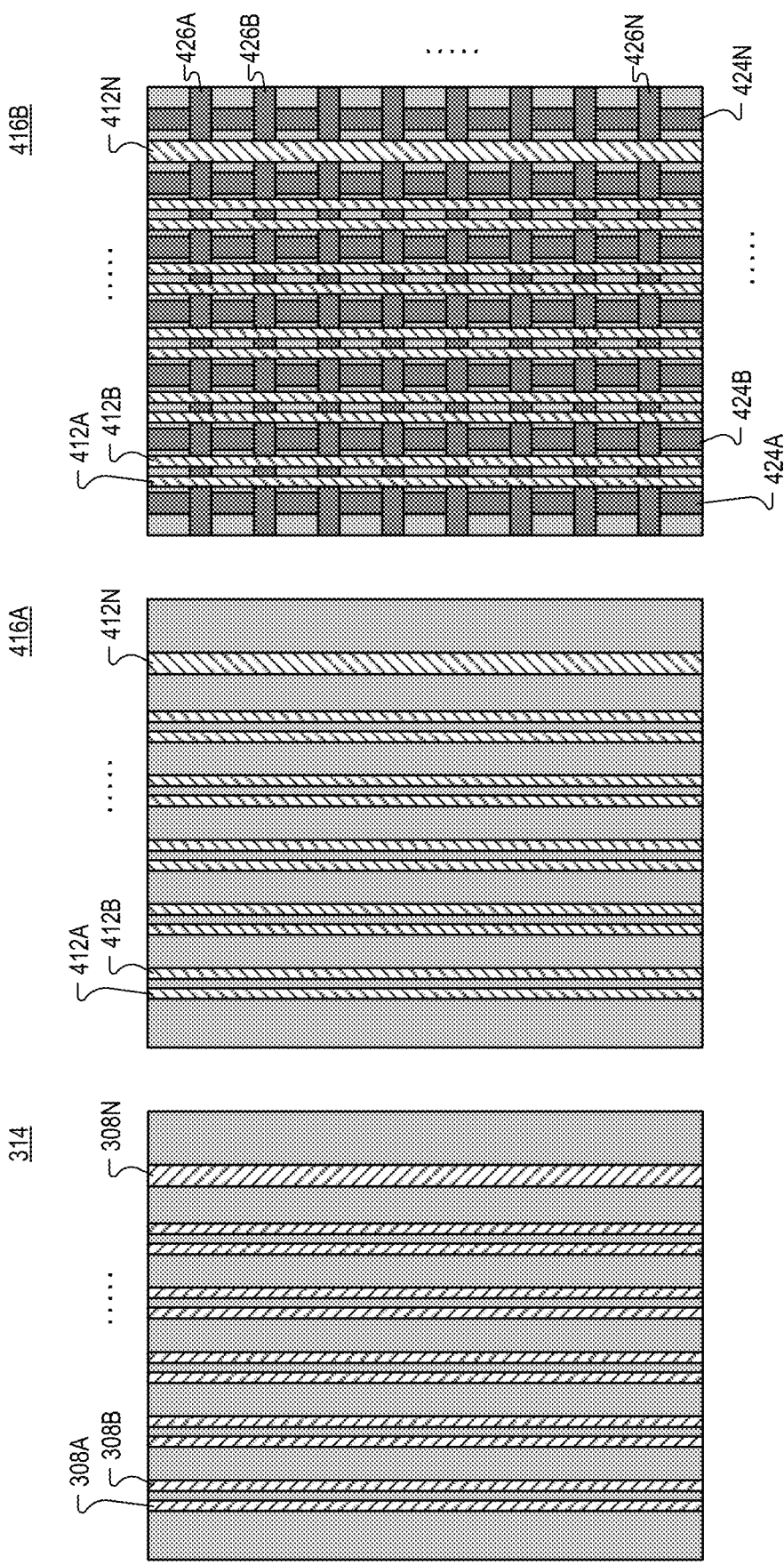

FLEXIBLE PRINTED CIRCUIT BOARD RETURN PATH DESIGN WITH ALIGNED COMPANION TRACE ON GROUND PLANE

BACKGROUND INFORMATION

Field of the Disclosure

The present invention is generally related to electronic devices, and more specifically, the present invention is directed to flexible printed circuit boards.

Background

Many electronic devices include a plurality of integrated circuit modules that receive power and/or communicate with one another through cables, printed circuit boards (PCBs), or the like. As technology continues to advance, the dimensions of electronic parts continue to shrink while the communications and clock speeds continue to increase. As such, the clock and communication connections between circuit modules over conductors that are acceptable for slow speeds suffer from transmission line complications when used in high speed applications, such as electromagnetic interference (EMI), signal loss, and other noise complexities that can result from unwanted reflections caused by impedance discontinuities in the transmission lines between circuit modules at the higher speeds.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 3 is a layout view of an example flexible first layer with a plurality of conductive traces in accordance with the teachings of the present invention.

FIG. 4A is a layout view of an example flexible second layer with a plurality of companion traces providing a reference plane in accordance with the teachings of the present invention.

FIG. 4B is a layout view of another example flexible second layer with a plurality of companion traces and a reference mesh providing a reference plane in accordance with the teachings of the present invention.

Figure 1:
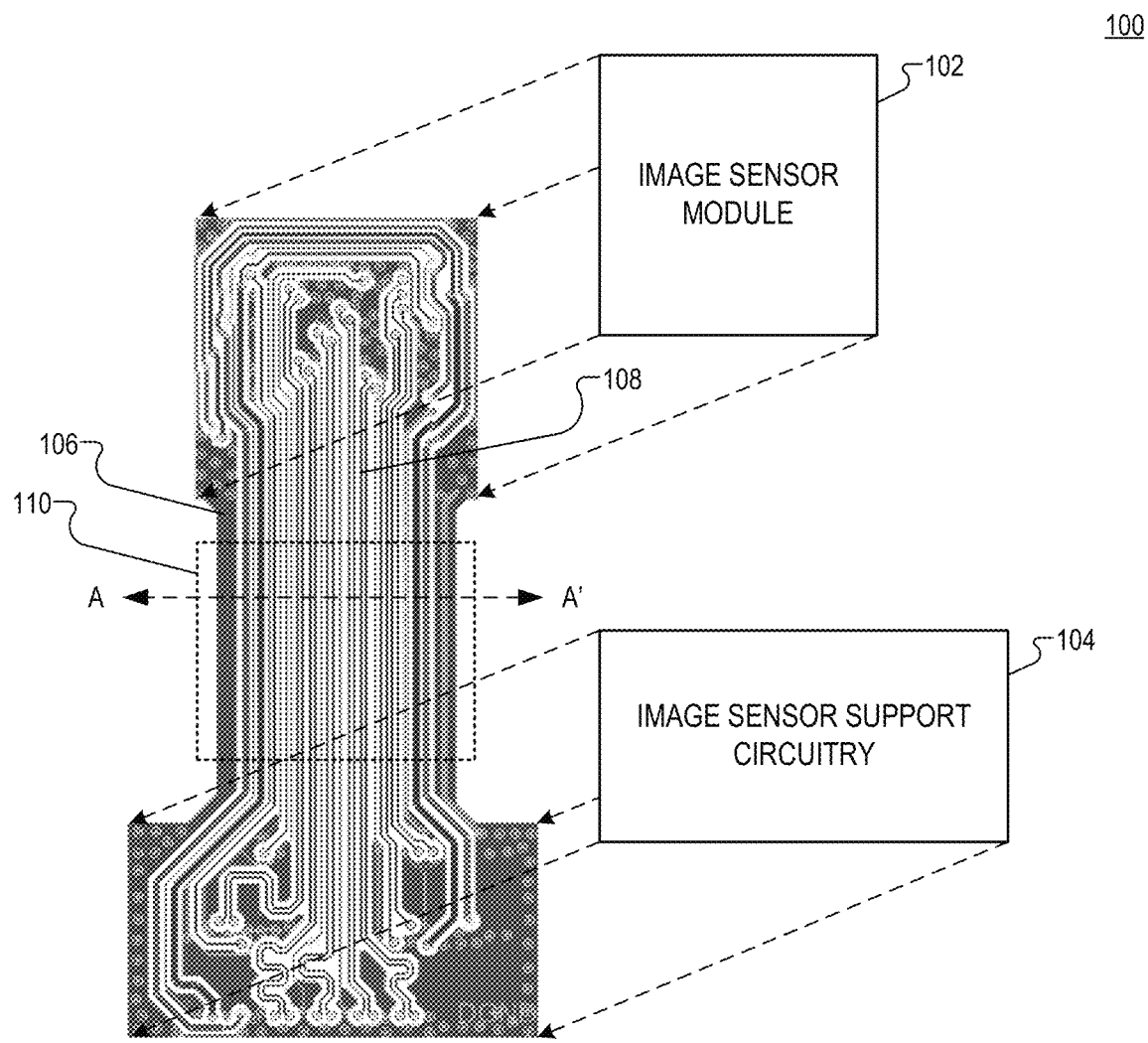
FIG. 1 is a block diagram illustrating an example imaging system including an image sensor module and image sensor support circuitry coupled to an example flexible printed circuit board in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Methods and apparatuses directed to flexible printed circuit boards with aligned companion traces in one or more reference planes are disclosed. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be shown, examples of a flexible printed circuit board (PCB) that can be used to couple circuit blocks together are disclosed. In various examples, the flexible PCB includes a flexible first layer and a flexible second layer proximate to the flexible first layer. A plurality of conductive traces are arranged in the flexible layer with a first circuit block coupled to a first end of the plurality of conductive traces, and a second circuit block is coupled to a second end of the plurality of conductive traces such that the first and second circuit blocks are coupled together through the plurality of conductive traces. A plurality of companion traces is arranged in the flexible second layer. The first circuit block coupled to the first end of the plurality of companion traces, and the second circuit block is coupled to the second end of the plurality of companion traces such that the flexible second layer provides a ground plane or reference plane for the first and second circuit blocks. In various examples, the plurality of companion traces is arranged in the flexible second layer to be a replica of the plurality of conductive traces in the flexible first layer such that each one of the plurality of conductive traces in the flexible first layer is proximate to and aligned with a corresponding one of the plurality of companion traces in the flexible second layer for an entire length between the first and second circuit blocks in accordance with the teachings of the present invention.

To illustrate, FIG. 1 is a block diagram illustrating an example electronic device such as an imaging system 100 including a first circuit block 102 and a second circuit block 104 coupled to an example flexible printed circuit board (PCB) 106. In the depicted example, the first circuit block 102 includes an image sensor module and the second circuit block 104 includes image sensor support circuitry for explanation purposes. It is appreciated that in other examples, first and second circuit blocks may include other types of circuits through which flexible PCB 106 provides high speed connections in accordance with the teachings of the present invention.

As shown in the example depicted in FIG. 1, a plurality of conductive traces 108 is arranged in a flexible first layer of flexible PCB. A first end of the plurality of conductive traces 108 is coupled to the first circuit block 102 at the first end of the flexible PCB, and a second end of the plurality of conductive traces 108 is coupled to the second circuit block 104 at the second end of the flexible PCB 106 such that the first circuit block 102 is coupled to the second circuit block 104 through the plurality of conductive traces 108.

Figure 2:
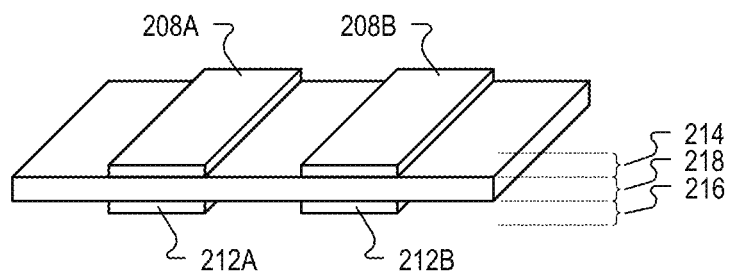
FIG. 2 is a cross section illustration of an example flexible printed circuit board including a flexible first layer with a plurality of conductive traces and a flexible second layer with a plurality of companion traces in accordance with the teachings of the present invention.

FIG. 2 is a cross section illustration of an example flexible PCB 206 in accordance with the teachings of the present invention. It is appreciated that flexible PCB 206 of FIG. 2 may be an example of a flexible PCB 106 of FIG. 1, and that similarly named and numbered elements referenced below may be coupled and function similar to as described above. For instance, it is appreciated that flexible PCB 206 of FIG. 2 may be a cross section illustration of flexible PCB 106 along dashed line A-A' of FIG. 1. In particular, the example of FIG. 2 shows that flexible PCB 206 includes a flexible first layer 214 in which a plurality of conductive traces 208A and 208B are arranged. Each of the plurality of conductive traces 208A and 208B is separated and spaced apart from one another in the flexible first layer 214 as shown. Flexible PCB 206 also includes a flexible second layer 216 proximate to the flexible first layer 214.

A plurality of companion traces 212A and 212B is arranged in the flexible second layer 216 such that the plurality of companion traces 212A and 212B provides a reference plane to circuit blocks that are coupled to the flexible PCB 206. As shown in the depicted example, the plurality of companion traces 212A and 212B is arranged in the flexible second layer 216 to a replica of the plurality of conductive traces 208A and 208B in the flexible first layer such that each one of the plurality of conductive traces 208A and 208B in the flexible first layer 214 is proximate to and aligned with a corresponding one of the plurality of companion traces 212A and 212B in the flexible second layer 216 for an entire length of the flexible PCB 206 between circuit blocks (e.g., first and second circuit blocks 102 and 104) that are coupled to the flexible PCB 206 in accordance with the teachings of the present invention.

In the illustrated example, flexible PCB 206 also includes a flexible spacer layer 218 disposed between the flexible first layer 214 and the flexible second layer 216. In one example, flexible spacer layer 218 includes a suitable dielectric material having a sufficient thickness to provide isolation between the plurality of conductive traces 208A and 208B in the flexible first layer 214 and the plurality of companion traces 212A and 212B in the flexible second layer 216. In one example, the plurality of conductive traces 208A and 208B and the plurality of companion traces 212A and 212B are made of a conductive material such as copper and are spaced 80 μm apart. In other examples, it is appreciated that the plurality of conductive traces 208A and the plurality of companion traces 212A and 212B may include other conductive materials and may be spaced apart by other distances in accordance with the teachings of the present invention.

FIG. 3 is a layout view of an example flexible first layer 314 with a plurality of conductive traces 308A, 308B, . . . 308N in accordance with the teachings of the present invention. It is appreciated that flexible first layer 314 of FIG. 3 may be an example of a flexible first layer 214 of FIG. 2, and that similarly named and numbered elements referenced below may be coupled and function similar to as described above. In addition, it is appreciated that the portion of flexible first layer 314 illustrated in FIG. 3 may correspond to the portion of the flexible PCB 106 in the dashed line rectangle identified with label 110 in FIG. 1. In the example depicted in FIG. 3, a plurality of conductive traces 308A, 308B, . . . 308N is arranged in the flexible first layer 314. In one example, each of the plurality of conductive traces 308A, 308B, . . . 308N is made of a suitable conductive material such as copper, and is separated and spaced apart from one another by a suitable distance, such as for example at least 80 μm. In one example, the plurality of plurality of conductive traces 308A, 308B, . . . 308N may carry power, high speed communications, clock signals, or other high speed signal routing. For instance, in one example, a first circuit block (e.g., 102) is coupled to a first end of the plurality of plurality of conductive traces 308A, 308B, . . . 308N and a second circuit block (e.g., 104) is coupled to a second of the plurality of plurality of conductive traces 308A, 308B, . . . 308N, such that the plurality of plurality of conductive traces 308A, 308B, . . . 308N is coupled between the first and second circuit blocks.

FIG. 4A is a layout view of an example flexible second layer 416A with a plurality of companion traces 412A, 412B, . . . 412N arranged therein providing a reference plane in accordance with the teachings of the present invention. It is appreciated that flexible second layer 416A of FIG. 4A may be an example of flexible second layer 216 of FIG. 2, and that similarly named and numbered elements referenced below may be coupled and function similar to as described above. In addition, it is appreciated that the portion of flexible first layer 416A illustrated in FIG. 4A may also correspond to the portion of the flexible PCB 106 in the dashed line rectangle identified with label 110 in FIG. 1. In the example depicted in FIG. 4A, a plurality of companion traces 412A, 412B, . . . 412N is arranged in the flexible second layer 416A to provide a ground plane or reference plane to the circuit blocks that are coupled to the flexible second layer 416A. In one example, the plurality of companion traces 412A, 412B, . . . 412N is made of a suitable conductive material such as copper, and each of the companion traces is also separated and spaced apart from one another by a suitable distance, such as for example at least 80 μm. As can be observed from the depicted example, the plurality of companion traces 412A, 412B, . . . 412N is arranged in the flexible second layer 416A to be a replica of the plurality of conductive traces 308A, 308B, . . . 308N in the flexible first layer 314 such that each one of the plurality of conductive traces 308A, 308B, . . . 308N in the flexible first layer 314 is proximate to and aligned with the corresponding one of the plurality of companion traces 412A, 412B, . . . 412N in the flexible second layer 416A for an entire length between circuit blocks (e.g., first and second circuit blocks 102 and 104) that are coupled to the flexible first layer 314 and the flexible second layer 416A.

FIG. 4B is a layout view of another example flexible second layer 416B with a plurality of companion traces 412A, 412B, . . . 412N and a reference mesh providing a ground plane or reference plane in accordance with the teachings of the present invention. It is appreciated that flexible second layer 416B of FIG. 4B may be another example of a flexible second layer 216 of FIG. 2, and that similarly named and numbered elements referenced below may be coupled and function similar to as described above. In addition, it is appreciated that the example flexible second layer 416B illustrated in FIG. 4B shares similarities with the example flexible second layer 416A illustrated in FIG. 4A. In particular, flexible second layer 416B of FIG. 4B also includes the plurality of companion traces 412A, 412B, . . . 412N that are arranged in the flexible second layer 416B to be a replica of the plurality of conductive traces 308A, 308B, . . . 308N in the flexible first layer 314 such that each one of the plurality of conductive traces 308A, 308B, . . . 308N in the flexible first layer 314 is proximate to and aligned with a corresponding one of the plurality of companion traces 412A, 412B, . . . 412N in the flexible second layer 416B for an entire length between circuit blocks (e.g., first and second circuit blocks 102 and 104) that are coupled to the ends of flexible first layer 314 and flexible second layer 416B to provide a ground plane or reference plane for the circuit blocks.

However, the example flexible second layer 416B illustrated in FIG. 4B further includes a ground mesh or reference mesh arranged in the flexible second layer and extending between the circuit blocks (e.g., first and second circuit blocks 102 and 104) that are coupled to the flexible PCB that includes flexible first layer 314 and flexible second layer 416B. As shown in the example depicted in FIG. 4B, the reference mesh includes a first plurality of conductive strands 424A, 424B, . . . 424N extending along a first dimension (e.g., the vertical dimension in FIG. 4B) of the reference mesh and a second plurality of conductive strands 426A, 426B, . . . 426N extending along a second dimension (e.g., the horizontal dimension in FIG. 4B) of the reference mesh. In the depicted example, the first dimension is orthogonal to the second dimension. In one example, each of the first plurality of conductive strands 424A, 424B, . . . 424N of the reference mesh are arranged in the flexible second layer 416B to extend between the first and second ends of the flexible PCB 416B. In other words, in one example, the first plurality of conductive strands 424A, 424B, . . . 424N of the reference mesh extend along the flexible PCB including flexible second layer 416B between a first circuit block (e.g., 102) coupled to one end of the flexible PCB and a second circuit block (e.g., 104) coupled to a second end of the flexible PCB. As shown in the example, the plurality of companion traces 412A, 412B, . . . 412N is arranged to be substantially parallel to the first plurality of conductive strands 424A, 424B, . . . 424N and substantially orthogonal or perpendicular to the second plurality of conductive strands 426A, 426B, . . . 426N.

It is appreciated that with each of the plurality of companion traces 412A, 412B, . . . 412N arranged in the flexible second layer 416A or 416B to be a replica of a corresponding one of the plurality of conductive traces 308A, 308B, . . . 308N in the flexible first layer 314, each one of the plurality of conductive traces 308A, 308B, . . . 308N in the flexible first layer 314 is proximate to and aligned with the corresponding one of the plurality of companion traces 412A, 412B, . . . 412N arranged in the flexible second layer 416A or 416B for an entire length between first and second circuit blocks (e.g., first and second circuit blocks 102 and 104) coupled to the ends of the flexible PCB. As such, high speed signal routing and communications are provided in accordance with the teachings of the present invention.

In particular, when high speed communications occur over the flexible PCB, such as for example communications at speeds of 5 GHz or above, the ordinary conductive traces begin to behave like transmission lines. However, with the reference plane provided by the plurality of companion traces 412A, 412B, . . . 412N arranged in the flexible second layer 416A or flexible second layer 416B to be proximate to and aligned with the plurality of conductive traces 308A, 308B, . . . 308N for the entire length of the flexible PCB between circuit blocks, there are substantially no impedance discontinuities, even in high speed applications in accordance with the teachings of the present invention. Furthermore, the signal routing paths between first and second circuit blocks (e.g., first and second circuit blocks 102 and 104) coupled to the ends of the flexible PCB are substantially similar through the conductive traces 308A, 308B, . . . 308N and their respective companion traces 412A, 412B, . . . 412N.

As a result, signal losses are reduced for high speed applications over flexible PCBs in accordance with the teachings of the present invention. For instance, if only a mesh ground plane is provided in flexible second layer 416B without the companion traces 412A, 412B, . . . 412N, resistive losses are suffered for the ground currents when only a mesh ground plane is used as a radio frequency (RF) ground. Furthermore, for high speed applications in which the flexible PCB behaves as a transmission line, whenever a discontinuity exists along the signal path or ground path, there will be an unwanted reflection generated in the transmission line due to the discontinuity. Thus, if only a mesh ground plane is provided in flexible second layer 416B without the companion traces 412A, 412B, . . . 412N, the transmission line impedance fluctuates periodically depending on whether or not a conductive trace 308A, 308B, . . . 308N is proximate to one of the plurality of strands 424A, 424B, . . . 424N, or 426A, 426B, . . . 426N, or one of the voids defined between the plurality of strands 424A, 424B, . . . 424N, or 426A, 426B, . . . 426N of the ground mesh. The resulting fluctuations in the impedance in the transmission line will cause discontinuities and consequently multiple reflections with increased signal loss.

Figure 5A:
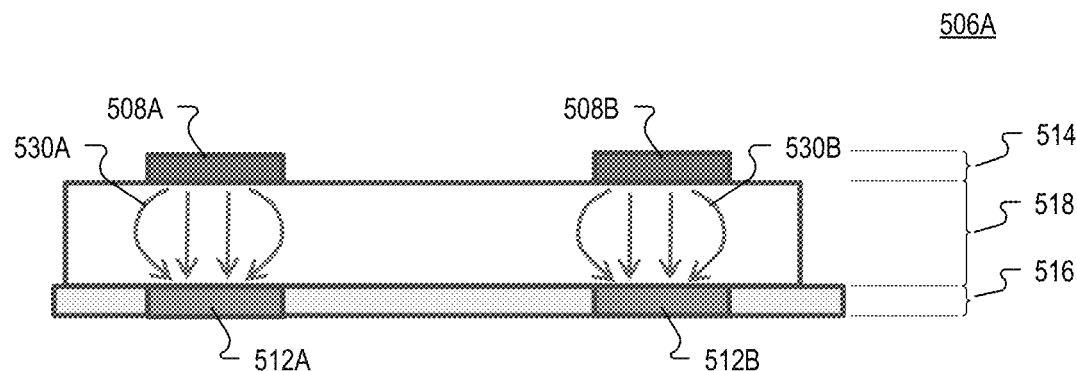
FIG. 5A is another cross section illustration of an example flexible printed circuit board illustrating the uniform electric fields for the length of the flexible printed circuit board between a flexible first layer with a plurality of conductive traces and a flexible second layer with a plurality of companion traces providing a reference plane in accordance with the teachings of the present invention.

In addition, it is appreciated that an electric field that is generated through a flexible spacer layer between each one of the plurality of conductive traces 308A, 308B, . . . 308N and the corresponding one of the plurality of companion traces 412A, 412B, . . . 412N is substantially uniform along the entire length of the flexible PCB. To illustrate, FIG. 5A is another cross section illustration of an example flexible PCB 506A showing a flexible first layer 514 and a flexible second layer 516 in accordance with the teachings of the present invention. It is appreciated that flexible PCB 506A of FIG. 5A may be an example of flexible PCB 106 of FIG. 1 or flexible PCB 206 of FIG. 2, or that flexible first layer 514 and flexible second layer 516 of FIG. 5A may be examples of flexible first layer 214 and flexible second layer 216 of FIG. 2, or of flexible first layer 314 of FIG. 3, or flexible second layers 416A or 416B of FIGS. 4A and 4B, and that similarly named and numbered elements referenced below may be coupled and function similar to as described above.

In particular, the example of FIG. 5A shows that flexible PCB 506A includes a flexible first layer 514 in which a plurality of conductive traces 508A and 508B are arranged and a flexible second layer 516 proximate to the flexible first layer 514. A plurality of companion traces 512A and 512B is arranged in the flexible second layer 516 to be a replica of the plurality of conductive traces 508A and 508B such that the plurality of companion traces 512A and 512B provides a reference plane to circuit blocks (e.g., first and second circuit blocks 102 and 104) that are coupled to the flexible PCB 506A. In the depicted example, a flexible spacer layer 518 is disposed between flexible first layer 514 and flexible second layer 516. As shown in the depicted example, each of the plurality of companion traces 512A and 512B is proximate to and aligned with a corresponding one of the plurality of conductive traces 508A and 508B along an entire length of the flexible PCB 506A between circuit blocks that are coupled to the flexible PCB 506A in accordance with the teachings of the present invention.

The example illustrated in FIG. 5A shows electric fields 530A and 530B that are generated between each of the plurality of companion traces 512A and 512B and the corresponding one of the plurality of conductive traces 508A and 508B through flexible spacer layer 518. It is appreciated that since each of the plurality of companion traces 512A and 512B is proximate to and aligned with the corresponding one of the plurality of conductive traces 508A and 508B along the entire length of the flexible PCB 506A, the electric fields 530A and 530B are substantially uniform along the entire length of the flexible PCB 506A between circuit blocks (e.g., first and second circuit blocks 102 and 104) that are coupled to the flexible PCB 506A in accordance with the teachings of the present invention. As such, it is appreciated that the impedance through transmission lines through the flexible PCB 506A is substantially continuous along the entire length of the flexible PCB 506A in accordance with the teachings of the present invention. In other words, there are substantially no impedance discontinuities along the entire length of the flexible PCB 506A between circuit blocks coupled to the plurality of conductive traces 508A and 508B and the plurality of companion traces 512A and 512B in accordance with the teachings of the present invention.

As such, it is appreciated that the clock and communication connections routed between circuit modules over the plurality of conductive traces 508A and 508B and the plurality of companion traces 512A and 512B do not suffer from transmission line complications that are associated with high speed communications, such as electromagnetic interference (EMI), signal loss, and other noise complexities that can result from unwanted reflections caused by impedance discontinuities in the transmission lines between circuit modules at the higher speeds in accordance with the teachings of the present invention.

Figure 5B:
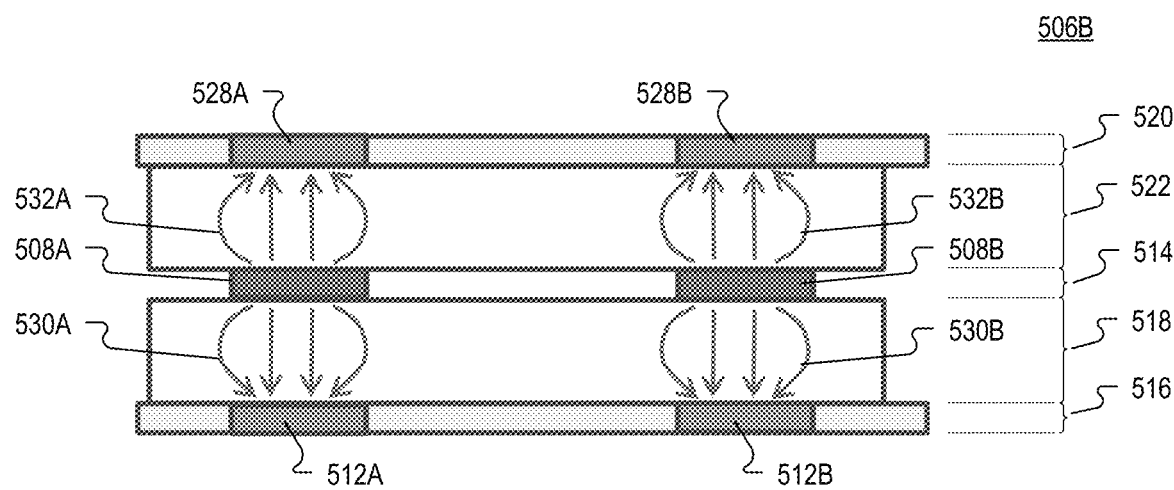
FIG. 5B is yet another cross section illustration of an example flexible printed circuit board illustrating the uniform electric fields for the length of the flexible printed circuit board between a flexible first layer with a plurality of conductive traces and flexible second and third layers with pluralities of companion traces providing reference planes in accordance with the teachings of the present invention.

FIG. 5B is yet another cross section illustration of an example flexible PCB 506B in accordance with the teachings of the present invention. It is appreciated that flexible PCB 506B of FIG. 5B may be an example of flexible PCB 106 of FIG. 1, flexible PCB 206 of FIG. 2, or flexible PCB 50A of FIG. 5A, and that similarly named and numbered elements referenced below may be coupled and function similar to as described above. In particular, it is appreciated that the flexible PCB 506B illustrated in FIG. 5B shares similarities with the example flexible PCB 506A illustrated in FIG. 5A. For instance, shows that flexible PCB 506B of FIG. 5B also includes a flexible first layer 514 in which a plurality of conductive traces 508A and 508B is arranged, and a flexible second layer 516 proximate to the flexible first layer 514 with a flexible spacer layer 518 disposed between the flexible first layer 514 and the flexible second layer 516. A plurality of companion traces 512A and 5212B is arranged in the flexible second layer 516 to be a replica of the plurality of conductive traces 508A and 508B such that the plurality of companion traces 512A and 512B provides a reference plane to circuit blocks (e.g., first and second circuit blocks 102 and 104) that are coupled to the flexible PCB 506B. In addition, a flexible spacer layer 518 is disposed between flexible first layer 514 and flexible second layer 516. As shown in the depicted example, each of the plurality of companion traces 512A and 512B is proximate to and aligned with a corresponding one of the plurality of conductive traces 508A and 508B along an entire length of the flexible PCB 506B between circuit blocks that are coupled to the flexible PCB 506B in accordance with the teachings of the present invention.

In the example depicted in FIG. 5B, flexible PCB 506B also includes a flexible third layer 520 proximate to the flexible first layer 514 such that the flexible first layer 514 is disposed between the flexible second layer 516 and the flexible third layer 520. In the depicted example, the flexible third layer 520 includes a second plurality of companion traces 528A and 528B arranged in the flexible third layer 520 and extending between the ends of the flexible PCB 506B to which circuit blocks (e.g., first and second circuit blocks 102 and 104) are coupled. In the depicted example, a second flexible spacer layer 522 is disposed between the flexible first layer 514 and the flexible third layer 520. In the depicted example, the flexible third layer 520 of the flexible PCB 506B is further coupled to provide a second ground plane or second reference plane that includes the second plurality of companion traces 528A and 528B and coupled to the circuit blocks.

As shown in the depicted example, the second plurality of companion traces 528A and 528B is also arranged in the flexible third layer 520 to be a second replica of the plurality of conductive traces 508A and 508B in the flexible first layer 514 such that each one of the plurality of conductive traces 508A and 508B in the flexible first layer 514 is proximate to and aligned with a corresponding one of the second plurality of companion traces 528A and 528B in the flexible third layer 520 along the entire length between the circuit blocks (e.g., first and second circuit blocks 102 and 104) that are coupled to flexible PCB 506B.

The example illustrated in FIG. 5B shows that in addition to the electric fields 530A and 530B that are generated between each of the plurality of companion traces 512A and 512B and the corresponding one of the plurality of conductive traces 508A and 508B through flexible spacer layer 518, electric fields 532A and 532B are also generated between each of the plurality of companion traces 528A and 528B and the corresponding one of the plurality of conductive traces 508A and 508B through flexible second spacer layer 522. As with each of the plurality of companion traces 512A and 512B, with each of the companion traces 528A and 528B being proximate to and aligned with the corresponding one of the plurality of conductive traces 508A and 508B along the entire length of the flexible PCB 506B, the electric fields 532A and 532B are substantially uniform along the entire length of the flexible PCB 506B between circuit blocks (e.g., first and second circuit blocks 102 and 104) that are coupled to the flexible PCB 506B in accordance with the teachings of the present invention. As such, it is appreciated that the impedance through transmission lines through the flexible PCB 506B is substantially continuous along the entire length of the flexible PCB 506B in accordance with the teachings of the present invention. In other words, there are substantially no discontinuities along the entire length of the flexible PCB 506A between circuit blocks (e.g., first and second circuit blocks 102 and 104) coupled to the plurality of conductive traces 508A and 508B and the plurality of companion traces 512A and 512B, and 528A and 528B in accordance with the teachings of the present invention.

As such, it is appreciated that the clock and communication connections routed between circuit modules over the plurality of conductive traces 508A and 508B and the plurality of companion traces 512A and 512B, and 528A and 528B do not suffer from transmission line complications that are associated with high speed communications, such as EMI, signal loss, and other noise complexities that can result from unwanted reflections caused by impedance discontinuities in the transmission lines between circuit modules at the higher speeds in accordance with the teachings of the present invention.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A flexible printed circuit board (PCB), comprising: a flexible first layer including a plurality of conductive traces arranged in the flexible first layer, wherein a first end of the plurality of conductive traces is coupled to a first circuit block at a first end of the flexible PCB, and wherein a second end of the plurality of conductive traces is coupled to a second circuit block at a second end of the flexible PCB such that the first circuit block is coupled to the second circuit block through the plurality of conductive traces, wherein the plurality of conductive traces are separated and spaced apart from one another in the flexible first layer; and a flexible second layer proximate to the flexible first layer, wherein the flexible second layer includes a plurality of companion traces arranged in the flexible second layer, wherein the flexible second layer of the flexible PCB is coupled to provide a reference plane, which is a ground plane to the first and second circuit blocks, including the plurality of companion traces and coupled to the first and second circuit blocks, wherein the plurality of companion traces is arranged in the flexible second layer to be a replica of the plurality of conductive traces in the flexible first layer such that each one of the plurality of conductive traces in the flexible first layer is proximate to and aligned with a corresponding one of the plurality of companion traces in the flexible second layer along an entire length between the first and second circuit blocks; wherein the reference plans in the flexible second layer further includes a reference mesh arranged in the flexible second layer and extending between the first and second ends of the flexible PCB.

2. The flexible PCB of claim 1, wherein the reference mesh includes a first plurality of conductive strands extending along a first dimension of the reference mesh and a second plurality of conductive strands extending along a second dimension of the reference mesh, wherein the first dimension is orthogonal to the second dimension.

3. The flexible PCB of claim 2, wherein the first plurality of conductive strands of the reference mesh are arranged in the flexible second layer to extend between the first and second ends of the flexible PCB.

4. The flexible PCB of claim 1, wherein transmission lines provided by the plurality of conductive traces has substantially uniform impedance per unit length along the entire length of the flexible PCB.

5. The flexible PCB of claim 1, wherein the plurality of conductive traces and the plurality of companion traces comprise copper.

6. The flexible PCB of claim 1, further comprising a flexible spacer layer disposed between the flexible first layer and the flexible second layer.

7. The flexible PCB of claim 1, wherein an electric field is generated through the flexible spacer layer between each one of the plurality of conductive traces and the corresponding one of the plurality of companion traces is substantially uniform along the entire length of the flexible PCB.

8. The flexible PCB of claim 1, further comprising a flexible third layer proximate to the flexible first layer such that the flexible first layer is disposed between the flexible second layer and the flexible third layer, wherein the flexible third layer includes a second plurality of companion traces arranged in the flexible third layer and extending between the first and second ends of the flexible PCB, wherein the flexible third layer of the flexible PCB is further coupled to provide a second reference plane, which is a second ground plane to the first and second circuit blocks, including the second plurality of companion traces and coupled to the first and second circuit blocks, wherein the second plurality of companion traces is arranged in the flexible third layer to be a second replica of the plurality of conductive traces in the flexible first layer such that each one of the plurality of conductive traces in the flexible first layer is proximate to and aligned with a corresponding one of the second plurality of companion traces in the flexible third layer along the entire length between the first and second circuit blocks.

9. The flexible PCB of claim 8, further comprising a second flexible spacer layer disposed between the flexible first layer and the flexible third layer.

10. The flexible PCB of claim 1, wherein signals and power are routed through the plurality of conductive traces.

11. An optical imaging system, comprising: a first circuit block including an optical image sensor module; a second circuit block including optical image sensor support circuitry; and a flexible printed circuit board (PCB) coupled between the first and second circuit blocks, wherein the flexible PCB comprises: a flexible first layer including a plurality of conductive traces arranged therein, wherein a first end of the plurality of conductive traces is coupled to the first circuit block at a first end of the flexible PCB, and wherein a second end of the plurality of conductive traces is coupled to the second circuit block at a second end of the flexible PCB such that the first circuit block is coupled to the second circuit block through the plurality of conductive traces, wherein the plurality of conductive traces are separated and spaced apart from one another in the flexible first layer; and a flexible second layer proximate to the flexible first layer, wherein the flexible second layer includes a plurality of companion traces arranged in the flexible second layer, wherein the flexible second layer of the flexible PCB is coupled to provide a reference plane, which is a ground plane to the first and second circuit blocks; including the plurality of companion traces and coupled to the first and second circuit blocks, wherein the plurality of companion traces is arranged in the flexible second layer to be a replica of the plurality of conductive traces in the flexible first layer such that each one of the plurality of conductive traces in the flexible first layer is proximate to and aligned with a corresponding one of the plurality of companion traces in the flexible second layer along an entire length between the first and second circuit blocks; wherein the flexible PCB wherein the reference plane in the flexible second layer further includes a reference mesh arranged in the flexible second layer and extending between the first and second ends of the flexible PCB.

12. The optical imaging system of claim 11, wherein the reference mesh includes a first plurality of conductive strands extending along a first dimension of the reference mesh and a second plurality of conductive strands extending along a second dimension of the reference mesh, wherein the first dimension is orthogonal to the second dimension.

13. The optical imaging system of claim 12, wherein the first plurality of conductive strands of the reference mesh are arranged in the flexible second layer to extend between the first and second ends of the flexible PCB.

14. The optical imaging system of claim 11, wherein transmission lines provided by the plurality of conductive traces have substantially uniform impedance per unit length along the entire length of the flexible PCB.

15. The optical imaging system of claim 11, wherein the flexible PCB further comprises a flexible spacer layer disposed between the flexible first layer and the flexible second layer.

16. The optical imaging system of claim 11, wherein the flexible PCB further comprises a flexible third layer proximate to the flexible first layer such that the flexible first layer is disposed between the flexible second layer and the flexible third layer, wherein the flexible third layer includes a second plurality of companion traces arranged in the flexible third layer and extending between the first and second ends of the flexible PCB, wherein the flexible third layer of the flexible PCB is further coupled to provide a second reference plane, which is a second ground plane to the first and second circuit blocks, including the second plurality of companion traces and coupled to the first and second circuit blocks, wherein the second plurality of companion traces is arranged in the flexible third layer to be a second replica of the plurality of conductive traces in the flexible first layer such that each one of the plurality of conductive traces in the flexible first layer is proximate to and aligned with a corresponding one of the second plurality of companion traces in the flexible third layer along the entire length between the first and second circuit blocks.

17. The optical imaging system of claim 16, wherein the flexible PCB further comprises a second flexible spacer layer disposed between the flexible first layer and the flexible third layer.

18. The optical imaging system of claim 11, wherein signals and power are routed through the plurality of conductive traces.

* * * * *